United States Patent
Vandensande (10) Patent No.: US 7,638,979 B2
(45) Date of Patent: Dec. 29, 2009

(54) METHOD AND SYSTEM FOR MONITORING BATTERY STACKS COMPRISING A CONTROLLER FOR CALCULATING A CORRECTION FACTOR USED TO CORRECT BATTERY VOLTAGE MEASUREMENTS

(75) Inventor: Geert Vandensande, Berbroek (BE)

(73) Assignee: Semiconductor Components Industries, L.L.C., Phoenix, AZ (US)

( * ) Notice: Subject to any disclaimer, the term of this patent is extended or adjusted under 35 U.S.C. 154(b) by 333 days.

(21) Appl. No.: 11/647,160

(22) Filed: Dec. 29, 2006

(65) Prior Publication Data

US 2007/0182377 A1    Aug. 9, 2007

(30) Foreign Application Priority Data

Dec. 29, 2005    (EP) .................................. 05078030

(51) Int. Cl.
H02J 7/00    (2006.01)
H02J 7/04    (2006.01)

(52) U.S. Cl. .................... 320/136; 320/118; 320/162

(58) Field of Classification Search .................. 320/118, 320/136, 162
See application file for complete search history.

(56) References Cited

U.S. PATENT DOCUMENTS

| | | | |
|---|---|---|---|
| 5,170,124 A | 12/1992 | Blair et al. | |
| 5,675,233 A | 10/1997 | Kaneko et al. | |
| 6,404,166 B1* | 6/2002 | Puchianu | 320/116 |
| 6,891,352 B2 | 5/2005 | Miyazaki et al. | |
| 2001/0026161 A1* | 10/2001 | Furukawa | 324/679 |
| 2003/0030442 A1 | 2/2003 | Sugimoto | |
| 2004/0178768 A1* | 9/2004 | Miyazaki et al. | 320/116 |
| 2004/0251874 A1* | 12/2004 | Petitdidier | 320/118 |
| 2007/0170889 A1* | 7/2007 | Ishikawa et al. | 320/116 |

FOREIGN PATENT DOCUMENTS

WO    WO 2005/017545 A    2/2005

* cited by examiner

Primary Examiner—Edward Tso
Assistant Examiner—Ahmed Omar
(74) Attorney, Agent, or Firm—Rennie W. Dover (57) ABSTRACT

A monitoring system (14, 24, 34, 50) monitors voltage of a stack of batteries (10, 20, 30.) Each battery has a plurality of cells (13). A monitoring unit (14, 24, 34) is associated with each battery and measures voltage across a selected cell. A first monitoring unit and a second monitoring unit measure the same cell, e.g. cell Cn,1 of battery 10. The first and second measurements are used to calculate a correction factor which can be used to correct a set of measurements made by one of the monitoring units (14, 24). The monitoring units (14, 24, 34) are arranged in a chain, with adjacent units in the chain being connected by a communication interface in which data is transmitted as signaling voltage levels between interface units. The interface units (16, 25) of a pair of monitoring units (14, 24) use the same signaling voltage levels.

18 Claims, 4 Drawing Sheets

METHOD AND SYSTEM FOR MONITORING BATTERY STACKS COMPRISING A CONTROLLER FOR CALCULATING A CORRECTION FACTOR USED TO CORRECT BATTERY VOLTAGE MEASUREMENTS

FIELD OF THE INVENTION

This invention relates to a monitoring system for a battery stack as well as to a method of monitoring a battery stack and a battery stack including the monitoring units. The present invention also relates to a controller for controlling the operation of the monitoring units

BACKGROUND TO THE INVENTION

There are various applications where it is necessary to use a stack of batteries. The batteries are typically arranged in series with one another to provide a power supply of a particular rated voltage to drive an electrical load. Battery stacks can be used as an energy store in electric or hybrid electric cars. Each battery within the overall stack comprises a number of individual battery cells. The lifetime of the batteries is strongly dependent on the way in which the batteries are charged and discharged. For Lithium-ion battery cells, the remaining capacity of the battery cells is directly proportional to the open-circuit voltage. Use of the battery and over-discharge of one cell will impact the lifetime of that cell and of the total battery. As explained in U.S. Pat. No. 6,891,352 a difference of 50 mV corresponds to a 5% difference in capacity of the cell. To prolong the lifetime of the cells the difference in voltage between the cells should be as low as possible, e.g. lower then a few tens of millivolts, such as less than 25 mV. It is also important to ensure that batteries (and individual cells within batteries) perform equally well. In view of the above, it is important to monitor the voltage accurately across each cell within a battery.

It has been found that a main error in a battery monitoring control unit is the voltage reference source, which is typically only accurate to +/−2% over the full temperature range. For a maximum cell voltage of 4.2V this gives a possible range of error of +/−84 mV, which is unacceptably high.

U.S. Pat. No. 6,891,352 describes apparatus for controlling a number of batteries. A control device is provided in each battery. The control device measures the voltage across each cell using a comparator, an analog-to-digital converter and a local voltage reference. An error compensation means compensates for the error of each voltage source and, in use, the control device applies an amount of compensation to a measurement.

It is known for each battery to include an integrated control unit. Where each battery has a local control unit, it is necessary to provide communication between the local control units and a main controller. U.S. Pat. No. 6,891,352 provides a local control unit at each battery and arranges the control units in a daisy-chain configuration. The control units at each end of the chain connect to a main control unit via opto-couplers. The use of an optical connection can reduce the effects of electrical interference on data and allow the level-shifting between the voltage difference between the battery-stack and the main-controller. The output toggles within its own supply range. The input of the next device will see a voltage higher then its own supply. Arranging the controllers in a chain minimises the number of opto-couplers and connecting lines that are required.

U.S. Pat. No. 6,404,166 similarly provides a cell monitoring device at each of a plurality of battery cells and arranges the cell monitoring devices in a daisy-chain configuration. The control units at each end of the chain connect to a central battery monitoring system. Measurements are passed from one cell monitoring device to the next cell monitoring device as binary data levels. An interface between each cell monitoring device uses a level-shifter to 'shift' the voltage levels from the range seen by one cell monitoring device to the range seen by the next cell monitoring device. However, the use of level-shifters is undesirable as the speed of the level-shifters is dependent on the value of the resistors used and the current that will flow. When using a daisy-chain the cell-voltage of all battery-cells has to be sent to the main-controller. For example, for a stack of 80 Lithium-ion cells this gives 80×10 bit or 800 bit. Together with the communication commands, the error-detection bits and start and stop of the commands the data can come to more then 2000 bits. If the main-controller cannot accept more then 100 ms delay between 2 measurements of all cells then the required data rate is 20 kbit/s. At that moment the slopes can be not more then a few microseconds. The level-shifters can be made faster but then they will consume more current during the active state.

Level-shifters also have the problem that they communicate between different supplies. These supplies are not identical and will see different noise signals during use of the battery-stack (noise coupled through the supply to the signals). This will require an extra filtering at the receiving input and higher voltage swing to increase the noise margin.

SUMMARY OF THE INVENTION

The present invention seeks to provide an improved monitoring system for a battery stack as well as a method of monitoring a battery stack. The present invention can reduce, minimise or overcome at least one of the problems of the prior art.

A first aspect of the present invention provides a monitoring system for monitoring voltage in a stack of batteries, each battery comprising a plurality of cells, the monitoring system comprising a plurality of monitoring units each one being associated with a battery and being operable to measure voltage across one or more selected cells of this battery, and wherein the monitoring system is arranged to:

measure a cell or group of cells, of one battery using a first monitoring unit, to provide a first voltage measurement;

measure the same cell, or group of cells, of the same battery using a second monitoring unit to provide a second voltage measurement; and, calculating a correction factor which can be used to correct a set of measurements made by one of the monitoring units by using the first and second measurements.

The use of a first monitoring unit and a second monitoring unit to measure the same cell of the same battery provides two measurements of the same cell. These are likely to have different values due to tolerances in components of the respective monitoring circuits. The voltage source in each monitoring circuit, which is used by the analog-to-digital converter (ADC) to derive a digital output value, is particularly prone to tolerance errors and shifts due to temperature. However, the first and second measurements can be used to calculate a correction factor which can then be used to correct an entire set of measurements made by one of the monitoring units.

An advantage of the present invention is that the calibration does not occur only at a factory, i.e. as a one-off calibration after manufacture. Also each local unit is not only provided with a fixed calibration value. The present invention has a benefit of being able to compensate over varying temperature ranges or over other varying environmental conditions rather than compensating only to fixed conditions which exist at the time of a one-off calibration.

A further advantage is that even if the absolute accuracy is not better than a certain such as value 2%, using overlaps between cells, i.e. monitoring the same cell with different monitoring units, can guarantee a higher relative accuracy. The present invention can achieve a maximum difference between the cells of 25 mV or less. The present invention will do the calibration between the different control devices. The present invention can calibrate out the difference between the different voltage references, e.g. with respect to different monitoring units.

A further advantage is that the present invention does not consume any current during the low or high state. It only consumes current to charge and discharge the pin-capacitance. The present invention allows data communication including check-bytes, status-bytes, parity bits. This will increase the bit rate which will require an higher speed but provides to the present invention the advantage of reliable communication. A further advantage of the present invention is that the same supply is used for the interface blocks. Any noise will not influence the signals. A low voltage signal will already have enough noise-margin for this short-distance communication.

In the simplest configuration, the first monitoring unit measures voltage across one cell, or a group of cells, of the battery with which it is associated. The second monitoring unit is associated with an adjacent battery and measures voltage across the same cell (or group of cells) of that battery. For many applications, the batteries will be arranged in series and the first and second monitoring units will be monitoring units which are associated with the batteries which are directly higher and lower in potential than each other.

The monitoring unit associated with each battery can comprise an input stage having a set of input lines which connect to terminals of the cells of the battery. The input stage further comprises as an additional input, an input line which connects to a terminal of a cell in an adjacent battery. In the case of series connected batteries, this can be a connection to the cell, or group of cells, directly adjacent to one end of the battery.

Preferably, the monitoring system comprises a central controller which is arranged to receive the voltage measurements and to calculate the correction factor. The central controller is aware of the relationship between monitoring units and cells, that is, it knows what cells a monitoring unit measures. The central controller will expect to receive measurements of a common cell, or group of cells, from a particular pair of monitoring units. Supporting these functions centrally allows each monitoring unit to be identical in form, thus reducing overall cost. However, as an alternative to using a central controller, the functions described here can be performed by a nominated monitoring unit, or distributed between the monitoring units.

Further aspects of the invention provide a monitoring unit and a controller for use as part of this monitoring system.

A further aspect of the invention provides a monitoring system for monitoring voltage in a plurality of batteries, each battery comprising a monitoring unit associated with the battery which is operable to measure voltage across the battery, or a cell within the battery, wherein the monitoring units are arranged in a chain, with adjacent units in the chain being connected by a communication interface in which data is transmitted as signalling voltage levels between interface units and the interface units of a pair of monitoring units use the same signalling voltage levels.

By providing that the interface units of a pair of monitoring units use the same signalling voltage levels there is no need to use level-shifters. Accordingly, there is no need for resistors or transistors such as PMOS or NMOS transistors for level shifting. The use of CMOS inputs and outputs without any level-shifting allows use of a simple CMOS-gate (PMOS and NMOS) without any other component. However the present invention is not limited thereto. The inputs can be more robust, e.g. a comparator to avoid high current consumption in case of an error on the bus.

Figure 1:
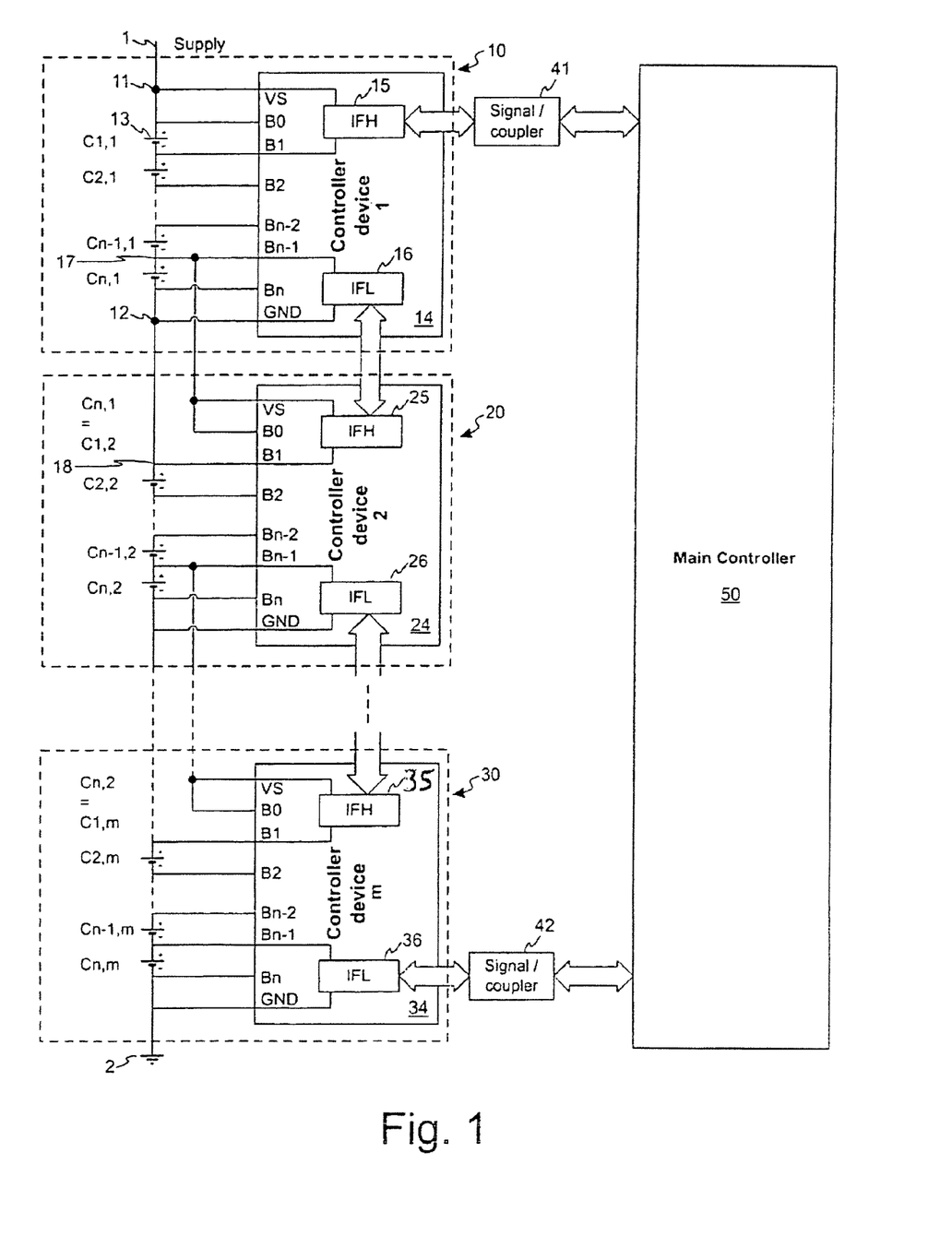
FIG. 1 shows an arrangement of batteries and a monitoring system according to a first embodiment of the invention.
Figure 2:
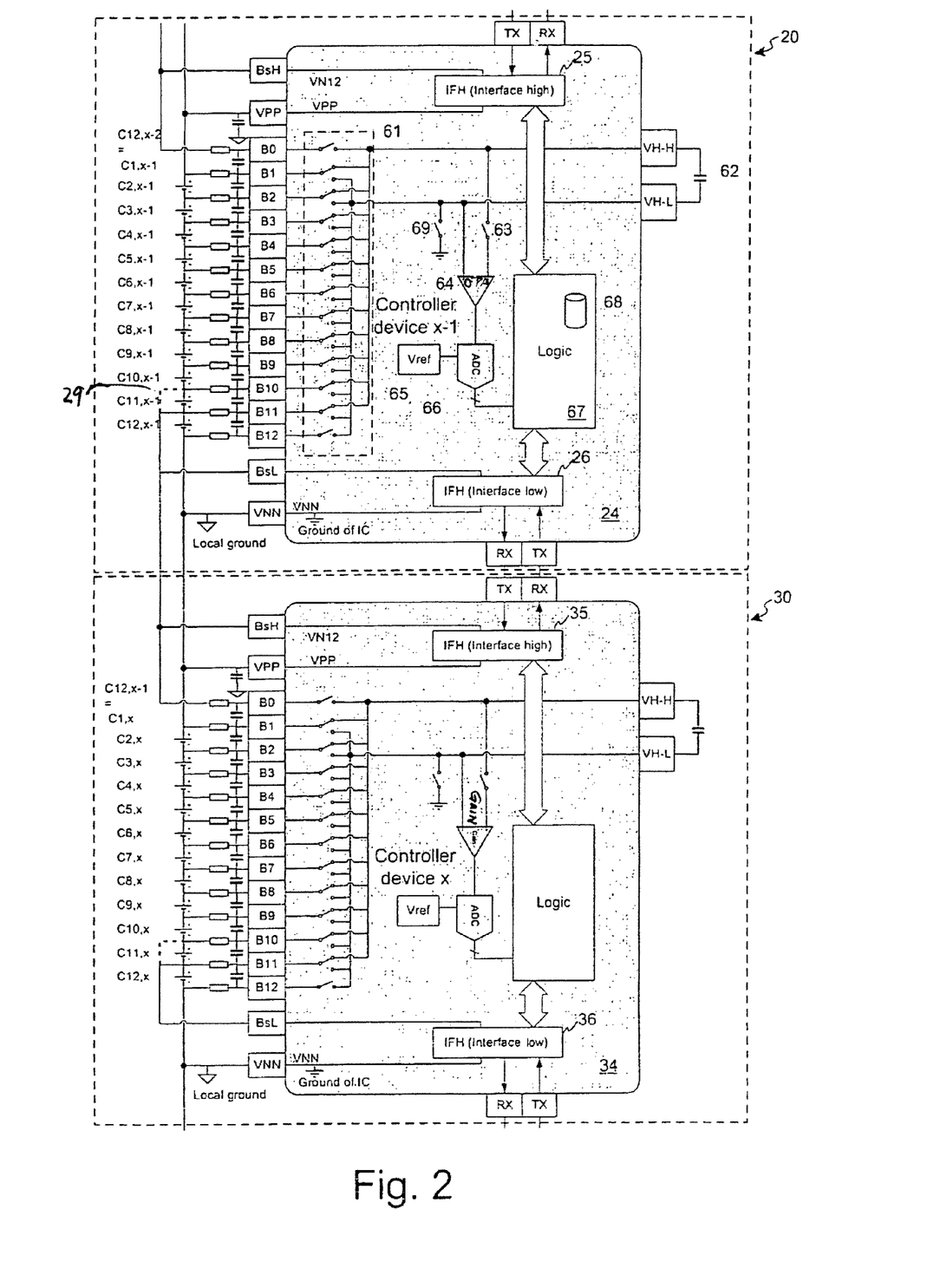
FIG. 2 shows two of the batteries of FIG. 1 in more detail.

The interface units can both be connected to the terminals of one cell, or a group of cells, in one of the pair of batteries associated with the monitoring units (see FIGS. 1 and 2). Alternatively, the interface units of a pair of monitoring units can both connect to a common terminal of the batteries and also receive a regulated supply from an output terminal of one of the batteries. This has an advantage that the interface circuits draw current equally from all of the cells of the batteries (see FIG. 4).

Either aspect of the invention can be used in connection with any type of battery technology, but especially secondary (rechargeable) batteries such as Lithium-Ion (Li-Ion), Lithium-Polymer (Li-Poly), Nickel Metal Hydride (Ni-MH), Lead-Acid, . . . .

BRIEF DESCRIPTION OF THE DRAWINGS

Embodiments of the invention will be described, by way of example only, with reference to the accompanying drawings in which.

DESCRIPTION OF PREFERRED EMBODIMENTS

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. Where the term "comprising" is used in the present description and claims, it does not exclude other elements or steps. Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

FIG. 1 shows an apparatus according to an embodiment of the present invention. Battery units 10, 20 30 are connected in series to provide a power supply with a pair of battery output terminals 1, 2. Although three battery units are shown in this simplified diagram, a power supply for an electric vehicle would typically comprise ten or more battery units. The power supply can be used to drive an electrical load, such as an electric motor, in a manner which will be well understood. Each battery unit 10, 20, 30 comprises a set of cells 13, e.g. mixed or identical cells 13, which are connected in series between terminals 11, 12. The battery stack comprises m batteries, each having n cells. In accordance with embodiments of the present invention, one battery unit, each battery unit or some of the battery units can have a different number of cells. For example, if the battery pack contains 58 cells then each battery unit need not monitor the same number of cells. Some of the inputs can stay unused. In accordance with an aspect of the present invention, all the cells are at the same voltage and if not some of them will be charged by an extra current to get them back at the same voltage. The individual cells are labelled using the notation $Cx,y$, where x represents the cell number and y represents the battery number. Thus, the first battery 10 has the cells $C1,1$ to $Cn,1$, the second battery 20 has the cells $C1,2$ to $Cn,2$ and so on.

Each battery unit 10, 20, 30 has a control unit 14, 24, 34 associated with it. The battery unit and the control unit together are called a local control unit in the following description. The battery unit and the control unit do not need to be physically together. For example, all the control units can be placed on one electronic device, e.g. a PCB, with the battery cells not on, but close to the PCB. A main controller 50 communicates with the local control unit 14, 24, 34 in some or each of the batteries 10, 20, 30. The control units and the main-controller operate at a different voltage. The total voltage of a battery pack can be higher then 300V. In such a case, communication between the battery units and the main controller is preferably by use of at least one opto-coupler or other signal coupler. More than one opto-coupler can be used, e.g. opto-couplers 41, 42. It is preferred if the number of signal couplers is reduced to a minimum, e.g. to lower cost. One method of cost reduction can be by implementing the communication channel between the units 10, 20, 30 and the main controller 50 as a daisy-chain. A control unit 14, 34 at least at one end of the chain communicates with the main controller 50. If a single coupler is used, the communication between the battery units always goes in one direction. In an alternative, a loop can be formed if control units 14, 34 at each end of the chain communicate directly with the main controller 50 via signal couplers 41, 42. The control unit 14 of battery 10 connects to the main controller 50 and the control unit 34 of battery 30 connects to the main controller 50. Within the chain, local control unit 14, 24 or 34 connects only to the local control units of adjacent battery units. In this case communication in both directions around the loop can be used. As an example, the local control unit 24 of battery 20 connects to the local control units on either side of it, e.g. to control units 14 and 34 of adjacent batteries 10 and 30. With respect to FIG. 1, there can be other batteries between battery 20 and battery 30, i.e. battery 30 on FIG. 1 might not be adjacent to battery 20 (see dashed lines). In this case unit 24 would connect to whatever control units were adjacent to it.

The connection between control units 14, 24, 34 is via interface units IFH, IFL (15, 25, 35; 16, 26, 36 respectively). An interface high (IFH) unit 15, 25, 35 is used for the interface to a battery of higher potential and an interface low (IFL) unit 16, 26, 36 is used for the interface to a battery of lower potential.

Measurements made by the local control unit of one battery are signalled to the local control unit of another battery across the interface and are eventually passed to the main controller 50. It is preferred that the signalling is digital signalling, with digital data represented by voltage levels. To simplify the interface between local control units, a respective pair of interface units 16, 25 have access to the same voltage levels for signalling use. Interface unit IFL 16 of battery 10 derives a supply from nodes 17, 12. Interface unit IFH 25 of battery 20 derives a supply from nodes 17, 18 (where nodes 12 and 18 are at the same potential.) This arrangement is repeated for other pairs of interface units IFH, IFL along the chain.

FIG. 2 shows two batteries 20, 30 from FIG. 1 in more detail. Local control unit 24 has a set of input ports B0-B12. Port B1 connects to the higher potential side of cell $C2,x-1$. Port B2 connects to the point between the lower potential side of cell $C2,x-1$ and the higher potential side of cell $C3,x-1$. Port B0 connects to the higher potential side of the last cell in the previous battery, or to a group of last cells in the previous battery (see dashed line in FIG. 2). This is best seen in battery 30, where port B0 connects to a line which is joined to port B11 (or any port B1 with i>1) of battery 20. The connections to ports B0, B1 allows battery 30 to measure the voltage across cell $C12,x-1$ of battery 20.

A selection device such as a switch, switches or a multiplexer 61 controls which inputs are applied to the measurement circuitry. When it is desired to measure the voltage across a cell, multiplexer 61 is instructed to select a pair of ports which are connected to the terminals of that cell. As an example, to measure cell $C2,x-1$ of battery 20 the ports B1, B2 are selected as inputs. A capacitor 62, attached to ports VH-H, VH-L, charges to the potential of the cell under test. Once capacitor 62 has charged, multiplexer 61 is opened and the capacitor becomes floating. Switch 63 and switch 69 are closed to apply the voltage across capacitor 62 as inputs to an amplifier 64 such as an op-amp. The output of op-amp 64 is applied to an analog-to-digital converter (ADC) 66. Typically, a 10 bit ADC is used. The ADC 66 uses a voltage reference 65. Local control unit 14 is controlled by a logic unit 67. Measurement data can be stored in storage or memory 68 before being transmitted to the main controller 50. In a next cycle the capacitor 62 is charged by another cell under test. It should be appreciated that a specific switching step for discharge of the capacitor is not required. The correct working of the multiplexer can be checked by other means, e.g. a current source at the output of the multiplexer can do this check.

In use, a local control unit 24 executes control logic of logic unit 67 which causes the control unit 24 to perform a series of measurements. This includes all of the steps just described above. Each measurement corresponds to the voltage between a pair of the ports B0-B12. The first measurement is between ports B0 and B1. As explained above, the connections between batteries is such that the voltage between ports B0, B1 corresponds to the voltage across the lowest potential cell in the previous battery. The local control unit measures this voltage in the same manner as the voltage across any other of that battery's own cells. The second measurement is between ports B1 and B2. This corresponds to the first (highest) cell in battery 20. The third measurement is between ports B2 and B3. This corresponds to the next cell in battery 20. This process continues until a measurement is made between ports B11 and B12. This corresponds to the last (lowest) cell in battery 20. With this arrangement, each adjacent pair of local control units measures one common cell in a battery. In the arrangement shown in FIG. 1, the common cells are the lowest cells in each of batteries 10, 20 . . . up to the penultimate battery. The battery 30 of lowest potential does not have a commonly monitored cell, as it has no further local monitoring units beneath it.

The measurement of the commonly monitored cell can be used to correct for calibration inaccuracies. The voltage across the commonly monitored cell will be the same at each measuring instant but, due to the inherent inaccuracy of the voltage source 65 used by ADC 66, the two control units are likely to report different voltage measurements of that common cell. A correction factor is calculated based on the two reported measurements of the common cell. The calculation of the correction factor is preferably performed by the main controller 50.

A further optional improvement is that the overlapping cells are not part of the normal measurement cycle but that they are only measured on request of the main controller. By doing so, the overlapping cells are measured at the same moment so that difference in time cannot influence the correction factor.

Figure 3:
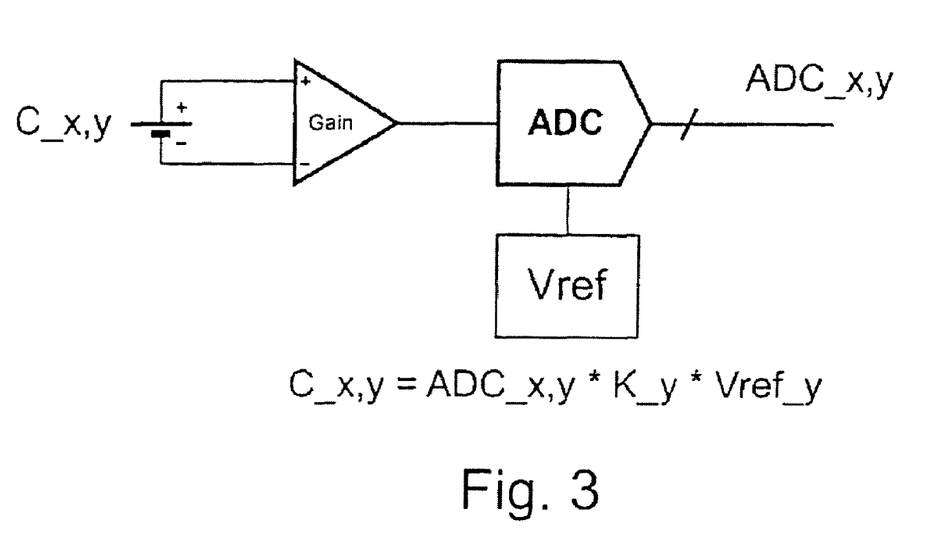
FIG. 3 shows the voltage measurement stage of one of the monitoring circuits of FIGS. 1 and 2; and, FIG. 4 shows a further embodiment of a monitoring system according to the present invention.

Referring to FIG. 3, the ADC output ADC_x,y can be written as (for local control unit of battery y):

$$C\_x,y = ADC\_x,y * K\_y * Vref\_y$$

where:
ADC_x,y=digital value for cell x as output by the ADC
Vref_y=value of voltage reference at the ADC
C_x,y=voltage of cell x (input to the ADC),
K_y=correction factor.

Written in a different way:

$$C\_x,y/(Vref\_y * K\_y) = ADC\_x,y$$

The correction factor K_y can be implemented with a high resolution e.g. with 10 bit resolution. This parameter is fully determined by matching of components and can be made very accurate (relative error of +/−0.1%+/−1 Least Significant Bit (LSB)). Vref is an absolute value and can only be made with an absolute accuracy of e.g. +/−2% over the full temperature range. Within the same device controller y, all cells are measured with the same Vref_y so that the relative error between the cells is only determined by the accuracy of the ADC +/−0.1% (absolute accuracy determined by Vref +/−2%). The cells measured by different device controllers are however measured by different ADCs with a different voltage reference. The relative error between cells of different local control units=+/−2%.

With this method, the main controller 50 will know that the bottom cell of device controller y is also measured as the top cell of device controller y+1, i.e. ADC_n,y should be the same as ADC_1,y+1

Any error between these cells can be used as correction factor.

$$C\_n,y = C\_1,y+1$$

$$C\_n,y = Vref\_y * K\_y * ADC\_n,y$$

$$C\_1,y+1 = Vref\_y+1 * K\_y+1 * ADC\_1,y+1$$

If we take the device controller y as reference, then we can calculate a correction factor for device y+1

$$\text{Correction factor} = \frac{ADC\_n, y}{ADC\_1, y+1}$$

To compare conversion results for y with conversion results y+1, the conversion results for y+1 are multiplied by the correction factor.

The measurements of device controller y+1 are to be multiplied with the correction-factor so that they have the same reference and a good relative accuracy. Returning to FIG. 1, let us assume that the battery associated with controller device 24 is discharging faster than the other batteries and that the two controller devices have no battery cell in common. We also assume that the reference voltage used by controller device 14 is equal to 1V and the reference voltage used by controller 24 is equal to 0.85V, e.g. caused by process variation. The A/D converters are 10 bit converter and measure voltages between, for instance, 0 and 2*Vref, i.e 0V corresponds to the digital code 0 and 2*Vref corresponds to the digital code 1024. Let us assume that the voltages across the battery cells of battery 14 is exactly 1V while it is exactly 0.9V for the battery cells of battery 24. Let controller device 14 measure the cell Cn,1. The A/D converter of controller devices 14 outputs the digital code 1024*1/2 =512. The operation is repeated with controller device 24 that measures its battery cells, for instance the cell C2,2. The A to D converter of controller device 24 outputs 1024*0.9/1.7=542. If we took those digital measurements at face value, we would wrongly say that battery 14 is discharging faster than battery 24. Let us now apply the invention, i.e. both controller device 14 and 24 measure the cell Cn,1. The ADC of controller device 14 outputs 512 when measuring the voltage drop across battery cell Cn,1 while the ADC of controller device 24 will output 1024*1/1.7=602. If both controller devices had the same reference voltage, they should have output the same digital code since they measure the same voltage. Since they do not, the main controller 50 knows that the reference of the ADC of controller device 24 is, in this example, smaller than the voltage reference of the ADC of controller device 14 and will correct the readings accordingly, i.e. if one wants to compare the voltages across the battery cells of battery 14 with those of battery 24, one will take the factor 512/602 into account. If one wants to know the conversion result of the voltage drop across the battery cells of battery 24 with the ADC of controller device 14, one multiplies the conversion results of that voltage drop given by the ADC of controller 24 by 512/602. In this case, one would have 542*512/602=460 and the main controller would correctly conclude that the battery cells in battery 24 are discharging faster than those of battery 14.

It is possible to compare conversion results made by the ADC of controller device 14 with those made by the ADC of controller device 34. i.e. knowing the correction factor between controllers (14, 24) and between controllers (24, 34) allows the controller 50 to know the correction factor (14, 34).

Comparison can still be done correctly with daisy chains with many, e.g. several dozens of controller devices. Let's take the example of 5 control-units {1,2,3,4,5}. In this case, we opt arbitrarily to take control unit 3 as the reference. The main controller can determine the correction factors K_3,4, K_3,2, K_2,1, K_4,5. By these correction factors the main-controller can correct the results for all battery-cells.

The corrected ADC-values will look as follows:
ADC_n,1 corrected at the level of control unit 3=ADC_n, 1*K_3,2*K_2,1
ADC_n,2 corrected at the level of control unit 3=ADC_n, 2*K_3,2
ADC_n,3=ADC_n,3 (no correction)
ADC_n,4 corrected at the level of control unit 3=ADC_n, 4*K_3,4 (1*relative error of correction factor)
ADC_n,5 corrected at the level of control unit 3=ADC_n, 5*K_3,4*K_4,5 (2*relative error of correction factors)

The relative accuracy will worsen for battery cells further a way from the reference because we get the error of more correction factors but the relative error will be still much lower then what we can expect of the absolute accuracy without any correction.

The main controller 50 can calculate, in the same way, the correction factor for all other local control units. All of the measurements made by a particular local control unit will be corrected using the calculated correction factor K_y,y+1. This will improve the relative accuracy of all cell measurements.

Looking at FIG. 2, it can be seen that each local control unit (other than the uppermost control unit) must make n cell voltage measurements, where n−1 of those measurements are cells in the battery associated with the local control unit and the remaining measurement is that of a cell of the adjacent battery.

As an alternative to the arrangement shown in FIGS. 1 and 2, the arrangement can be reversed so that it is the bottom control unit which only measures it's own cells, and all other control units which are connected in the 'overlapping' manner.

The apparatus shown in any of the embodiments of the present invention can be used with batteries having, for example, ten or more cells. For Lithium Ion battery technology this equates to 10×4.7V cells, giving a total battery voltage of 47V.

As the number of cells monitored by a local control unit increases, the local control unit requires a higher input range and preferably requires a high CMRR (Common mode rejection ratio). The arrangement shown in FIG. 2 optionally uses an external capacitor 62 to sample the cell voltage. The term 'external' means the capacitor does not form part of the integrated circuit (IC) of the control unit 14, but is connected to it via pins on the IC. This can avoid the large parasitic capacitance which would occur if the capacitor were realised as an integrated capacitor on the IC itself. Using an external capacitor also allows easy access to the multiplexer, which simplifies the test of the integrated high-voltage multiplexer. The parasitic capacitors would change the capacitor voltage when switching the capacitor from the multiplexer to the input of the measurement block.

The main microcontroller 50 receives all cell voltages as measured by the local control units. The measurements are reported to the main controller 50 via the daisy chain of interfaces and the signal couplers 41, 42. The main controller knows the relationship between cells of batteries 10, 20, 30 and knows which pair of local control units are measuring the same cell voltage. Based on this overlap, the main controller 50 can correct the reported results of all local control units relative to one IC. This correction excludes the tolerance due to the voltage reference so that a relative accuracy of 0.2% or +/−10 mV can be achieved. This result can be achieved, for example, when at least an accuracy of 10 bit is realized, e.g. for the ADC. In general the invention can be applied with any resolution as long as the resolution of the ADC is not worse than the required precision.

For accurate calculation of the correction factor, it is preferred that a pair of measurements of a common cell, made by different local control units, should be made at the same time. This can be achieved by arranging for local control units to make a voltage measurement of the common cell upon receiving a command from the main controller via the communication interface. Preferably, the circuit components are chosen to reduce noise in the signals. For example, the sample capacitor is preferably chosen high enough so that extra filtering makes sure that the samples at the two ICs are not disturbed by high frequency signals at the moment of taking the sample. The extra filtering can be provided by the combination of a series resistor (parasitic resistance of the switches) and the sampling capacitor itself (mere RC filter). This extra filtering protects the sampled signals against noise, e.g. caused by the switching itself but also external noise. This extra filtering complements the filtering made with the RC filter at the inputs.

Figure 4:
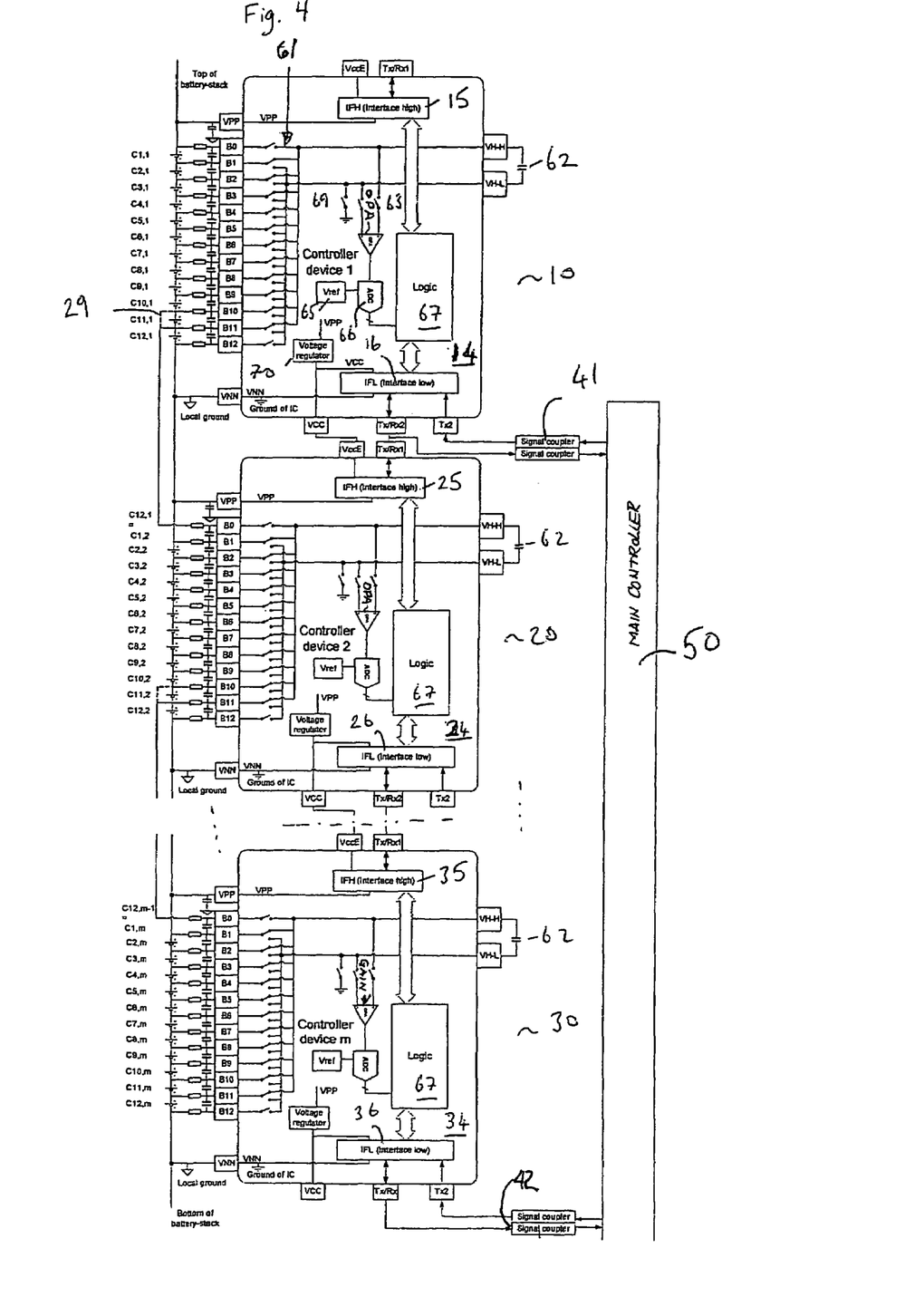

In the embodiments shown in FIGS. 1 and 2 or 4, it is the cell, or group of cells, nearest the VNN terminal of a battery which is the common cell, i.e. which is monitored by the control unit of that battery and the control unit of the adjacent battery. However, the common cell, or group of cells, control unit can be any other cell, or group of cells, within the battery.

Referring again to FIG. 1, it was explained how the interface units 16, 25 of adjacent local control units access the same signalling voltages. In FIG. 1 the potentials at each side of cell Cn,1 are used as signalling voltages. In some cases, for example, where Li-Ion technology is used, this arrangement may be sufficient. In other cases, it is possible to use the potentials at each side of a pair of cells as signalling voltages. FIGS. 2 and 4 show, via a dashed line 29, how the signalling voltages are taken as the potential at the top of cell C11, x−1 and the base of cell C12,x−1. The potential at the lowest potential side of cell C12,x−1 is taken as the local ground for the local control unit of battery 10.

In FIG. 2, the supply to the Interface High unit (IFH) is taken from nodes BsH and VPP (where VPP is the positive terminal of the battery) and the supply to the Interface Low unit (IFL) is taken from nodes BsL and VNN.

In a further improvement, shown in FIG. 4, the supply for the communication signalling voltages between local control units is derived from the battery terminals VPP, VNN. The reference numbers in FIG. 4 refer to the same components and functions as in FIGS. 1 and 2. The general operation of the controllers in FIG. 4 are as described for the controllers of FIGS. 1 and 2. A supply line VPP provides a supply to a voltage regulator 70 within the local control unit. This regulator 70 outputs a regulated voltage VCC for an IFL unit such as 16, where the regulated voltage is in the range VNN<VCC<VPP. This regulated voltage is also made available to the IFH unit of the adjacent local control unit, e.g. 25 of unit 30, via an output pin VCC. The adjacent control unit has an input VccE to receive the regulated voltage as an input. Using the terminal VPP as the source of the power supply to the voltage regulator 70, the interface units draws current equally from all of the cells of the battery, rather than one or two particular cells of the total set of cells of the battery. In a similar manner, the overall power supply for the control unit is derived from the VPP terminal. The upper interface 15 is no powered.

As previously described, the interface between local control units in any of the embodiments of the present invention can take the form of a daisy chain. The chain can be a unidirectional ring, with data being sent in one direction only. In this case, each IFH and IFL unit has only a transmitter or a receiver, depending on the direction of travel around the loop. A local control unit i−1 sends messages to local control unit i and local control unit i sends messages to local control unit i+1. Alternatively, the chain can be a bi-directional ring, with data being sent in either (or both) directions, with a local control unit i sending and receiving messages to/from local control units i−1 and i+1. In this case, each IFH and IFL unit has both a transmitter and a receiver to support bi-directional communication. Referring to FIG. 4, the top and bottom local control units at each end of the chain are required to interface to an opto-coupler while the local control units part-way along the chain only connect to adjacent local control units. It is preferred that one type of local control unit is provided with the capability (e.g. is provided with terminals TX2/RX2) to connect to adjacent local control unit or an opto-coupler. This minimises the unit cost of the local control unit as the same type of unit is used regardless of it's position in the chain. When the local control unit is used at the ends of the chain, a connection is made between the TX2 port and an opto-coupler as input from the main-controller and between Tx/Rx2 port and an opto-coupler as output to the main-controller. When the local control unit is used elsewhere in the chain the TX2/RX2 port is connected to TxRx1 of the next unit-controller and the port Tx2 is unconnected.

The measurements made by the monitoring circuit described above can be used to provide status information to a user or other control application and can be used to control charging of the cells. However, these functions are not important to the present invention and will not be described.

The invention is not limited to the embodiments described herein, which may be modified or varied without departing from the scope of the invention.

What is claimed is:

1. A monitoring system for monitoring voltages in a stack of batteries, each battery comprising a plurality of cells, the monitoring system comprising:
   a first monitoring unit for measuring a voltage of a first battery and a second monitoring unit for measuring a voltage of a second battery, the first monitoring unit operable to selectively measure a voltage across a cell or group of cells of the first battery to provide a first voltage measurement;
   the second monitoring unit operable to selectively measure a voltage across the same cell or the same group of cells of the first battery to provide a second voltage measurement; and
   means to calculate, based on the first and the second measurements, a correction factor useable to correct a set of voltage measurements made by at least one of the first and second monitoring units.

2. The monitoring system according to claim 1 wherein the first monitoring unit is arranged to measure voltage across a cell or group of cells of the first battery.

3. The monitoring system according to claim 1 wherein the first and second batteries are adjacent batteries in the stack of batteries.

4. The monitoring system according to claim 3 wherein the first monitoring unit comprises an input stage having a set of input lines which connect to terminals of the cells in the first battery, and the input stage further comprises as an additional selectable input line which connects to a terminal of a cell in an adjacent battery.

5. The monitoring system according to claim 4 wherein the first and second monitoring units are arranged to sample a voltage across a cell or group of cells using a sampling capacitor, and wherein the first and second monitoring units are provided as an integrated circuit and the sampling capacitor is external to the integrated circuit.

6. The monitoring system according to claim 1, wherein each monitoring unit comprises an analog-to-digital converter having a local voltage reference source.

7. The monitoring system according to claim 1 further comprising a central controller and wherein the central controller is arranged to receive the voltage measurements and to calculate the correction factor.

8. The monitoring system according to claim 7 wherein the monitoring units are arranged in a chain, and wherein only the monitoring units at each end of the chain have a signaling connection to the central controller.

9. A method of monitoring voltages of a stack of batteries, each battery comprising a plurality of cells and a having a plurality of monitoring units each associated with a battery, wherein a first monitoring unit of the plurality of monitoring units is for measuring a voltage of a first battery of the stack of batteries and a second monitoring unit of the plurality of monitoring units is for measuring a voltage of a second battery of the stack of batteries, the method comprising:
   measuring a first cell or a first group of cells of the first battery with the first monitoring unit to provide a first voltage measurement;
   measuring the first cell or the first group of cells of the first battery with the second monitoring unit to provide a second voltage measurement; and
   calculating a correction factor useable to correct a set of measurements made by one of the monitoring units based on the first and second measurements.

10. The method according to claim 9 wherein the first and second monitoring units are associated with adjacent batteries in the stack of batteries.

11. The method according to claim 9, further comprising sampling a voltage across a cell, or group of cells using a sampling capacitor.

12. The method according to claim 9 further comprising analog-to-digital conversion of a voltage measurement using a local voltage reference source.

13. The method of claim 9 further comprising receiving the voltage measurements at a central controller and calculating the correction factor in the central controller.

14. A controller for use as part of a monitoring system for monitoring voltage in a stack of batteries, each battery comprising a plurality of cells, the monitoring system comprising:
   a plurality of monitoring units, wherein a particular pair of the plurality of monitoring units includes
   a first monitoring unit for measuring a voltage of a first battery;
   a second monitoring unit for measuring a voltage of a second battery; wherein
      the first monitoring unit is operable to measure voltage across one or more selected cells of the first battery; and
      the second monitoring unit is operable to measure voltage across one or more selected cells of the second battery and a voltage across the same one or more selected cells of the first battery; and wherein the controller comprises an interface to receive measurements from the first and second monitoring units and control logic comprising:
   means to receive a first voltage measurement from the first monitoring unit, the first voltage measurement of the cell or group of cells of the first battery;
   means to receive a second voltage measurement from the second monitoring unit, the second voltage measurement of the same cell or group of cells of the same battery as the first monitoring unit; and
   means to calculate a correction factor based on the first and second voltage measurements useable to correct a set of measurements made by one of the first and second monitoring units and wherein the calculation means expects to receive measurements of a common cell or group of cells from the particular pair of monitoring units.

15. A plurality of monitoring units for use as part of a monitoring system for monitoring voltage in a stack of batteries, each battery comprising:
   a plurality of cells, wherein a first monitoring unit of the plurality of monitoring units is associated with a first battery, is operable to selectively measure a voltage of a cell or group of cells of the first battery to provide a first set of voltage measurements, and is further operable to selectively measure a voltage across a cell or group of cells of a first battery to provide a first voltage measurement, and comprises an input stage having a set of selectable input lines which connect to terminals of the cells of the first battery, the input stage further comprising an additional set of selectable input lines which connects to terminals of the cells in a second battery and wherein the first monitoring unit is operable to measure voltage across a selected cell or group of cells of the first battery, or of the cell or group of cells of the second battery by selection of the input lines; and wherein a second monitoring unit of the plurality of monitoring units is associated with the second battery and is operable to selectively measure a voltage across a same cell or a same group of cells of the first battery as the first monitoring unit to provide a second voltage measurement; and a controller for calculating a correction factor based on the first voltage measurement of the first monitoring unit and the second voltage measurement of the second monitoring unit, wherein the correction factor is useable to correct the set of voltage measurements made by the first monitoring unit or to correct a set of voltage measurements made by the second monitoring unit.

16. The monitoring system of claim 1, wherein a plurality of monitoring units are arranged in a chain, with adjacent monitoring units in the chain being connected by a communication interface in which data is transmitted as signaling voltage levels between interface units, and the interface units of a pair of monitoring units use the same signaling voltage levels; and a controller suitable for calculating a correction factor which is useable to correct a set of measurements made by at least one monitoring unit of the plurality of monitoring units.

17. The monitoring system according to claim 16 wherein interface units of a pair of monitoring units are both connected to the terminals of one cell, or a group of cells, in one of the pair of batteries associated with the monitoring units.

18. The monitoring system according to claim 16 wherein interface units of a pair of monitoring units are both connected to a common terminal of the batteries and also receive a regulated supply from an output terminal of one of the monitoring units.

* * * * *